United States Patent
Park et al.

(10) Patent No.: US 7,394,700 B2
(45) Date of Patent: Jul. 1, 2008

(54) PROGRAMMING METHODS FOR A NONVOLATILE MEMORY DEVICE USING A Y-SCAN OPERATION DURING A VERIFY READ OPERATION

(75) Inventors: Min-gun Park, Gyeonggi-do (KR); Jin-yub Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 212 days.

(21) Appl. No.: 11/424,575

(22) Filed: Jun. 16, 2006

(65) Prior Publication Data

US 2007/0136563 A1    Jun. 14, 2007

(30) Foreign Application Priority Data

Jun. 17, 2005  (KR) ...................... 10-2005-0052484

(51) Int. Cl.
*G11C 11/34* (2006.01)

(52) U.S. Cl. .......................... 365/185.22; 365/185.18; 365/185.25

(58) Field of Classification Search ............ 365/185.22, 365/185.18, 185.25
See application file for complete search history.

(56) References Cited

U.S. PATENT DOCUMENTS 6,331,945 B1 *  12/2001  Shibata et al. ......... 365/185.03
7,184,356 B2 *   2/2007  Noguchi et al. ........ 365/230.03

FOREIGN PATENT DOCUMENTS

| JP | 2003-249082 | 9/2003 |
| KR | 1020030001611 A | 1/2003 |
| KR | 1020030018357 A | 3/2003 |

* cited by examiner

*Primary Examiner*—Son Dinh
(74) *Attorney, Agent, or Firm*—Myers Bigel Sibley & Sajovec, P.A.

(57) ABSTRACT

Some embodiments of the present invention provide programming operations for reducing a program time for a nonvolatile memory device. A nonvolatile semiconductor memory device is programmed by receiving data to be programmed into memory cells from a host, programming the data into the memory cells, performing a verify read operation to determine whether the data has been successfully programmed into the memory cells, and performing a Y-scan operation while performing the verify read operation to sequentially scan and output data read from bit lines coupled to the memory cells.

15 Claims, 6 Drawing Sheets

PROGRAMMING METHODS FOR A NONVOLATILE MEMORY DEVICE USING A Y-SCAN OPERATION DURING A VERIFY READ OPERATION

CROSS-REFERENCE TO RELATED PATENT APPLICATION

This application claims the benefit of Korean Patent Application No. 10-2005-0052484, filed on Jun. 17, 2005, in the Korean Intellectual Property Office, the disclosure of which is incorporated herein in its entirety by reference.

BACKGROUND OF THE INVENTION

1. Field of the Invention

The present invention relates to nonvolatile memory devices and, more particularly, to flash memory devices, 2. Description of the Related Art Electrically erasable and programmable flash memory can preserve data even when electric power is not provided. In particular, because such flash memory has a string structure in which a plurality of flash memory cells are connected in series, NAND-type flash memory may facilitate integration and can be provided at low cost. For these reasons, NAND-type flash memory has been used as data memory in diverse portable products.

A flash electrically erasable programmable read-only memory (EEPROM) cell transistor may be programmed or erased using the Fowler-Nordheim (FN) tunneling mechanism. An operation of erasing the cell transistor may be performed by applying a ground voltage of 0 V to a control gate of the cell transistor and applying a voltage (e.g., 20 V) higher than a power supply voltage to a semiconductor substrate (or bulk). According to such a bias condition, a strong electric field may be formed between a floating gate and a bulk due to a great voltage difference therebetween. As a result, electrons in the floating gate are discharged to the bulk due to an FN tunneling effect. Here, the threshold voltage of the erased cell transistor may shift to a negative value, for example, −3 V. This state is defined as data "1" and an EEPROM cell in this state is referred to as an "ON-cell."

An operation of programming the cell transistor is performed by applying a voltage (e.g., 18 V) higher than the power supply voltage to the control gate and applying the ground voltage to a drain and the bulk. Under such a bias condition, electrons are injected into the floating gate of the cell transistor due to the FN tunneling effect. Here, the threshold voltage of the programmed cell transistor may shift to a positive value, for example, +1 V. This state is defined as data "0" and an EEPROM cell in this state is referred to as an "OFF-cell."

FIG. 1 is a block diagram of a conventional NAND-type flash memory device. Referring to FIG. 1, the NAND-type flash memory device includes a memory cell array 10, a row selection circuit (or a row decoder circuit) 12, a page buffer circuit (or a data sensing and latching circuit) 14, and a column decoder circuit 16.

The memory cell array 10 includes a plurality of memory blocks BLK0 through BLKn (where "n" is a positive integer), each of which includes a plurality of strings. As illustrated in FIG. 1, each string includes a string selection transistor (SST) connected to a corresponding bit line, e.g., BL0, a ground selection transistor (GST) connected to a common source line (CSL), and memory cells MC15 through MC0 connected between the SST and the GST. The SST, the memory cells MC15 through MC0, and the GST are respectively connected to a string selection line (SSL), word lines WL15 through WL0, and a ground selection line (GSL). Block selection transistors BS17 through BS0 respectively corresponding to the lines, i.e., the SSL, the word lines WL15 through WL0, and the GSL are controlled in common by a block selection signal BS.

The row selection circuit 12 selects one word line (or one page) among the word lines WL0 through WL15 through the block selection transistors BS0 through BS17. The page buffer circuit 14 temporarily stores data to be stored in memory cells of the selected page or senses data stored in the memory cells of the selected page. The page buffer circuit 14 comprises a plurality of page buffers (or data sensing and latch blocks) respectively corresponding to columns, i.e., bit lines related with the selected page. Data bits sensed from the memory cells of the selected page are output through the column decoder circuit 16 in predetermined units (for example, in byte units (×8)).

FIG. 2 illustrates part of a conventional column decoder circuit. The column decoder circuit illustrated in FIG. 2 corresponds to a single data line. The same circuit structure as that illustrated in FIG. 2 may be provided to correspond to each of other data lines. In FIG. 2, a reference character "ND_LAT" denotes a latch node of the page buffer circuit 14 shown in FIG. 1. First selection signals YA0 through YA15 are sequentially activated, and simultaneously, second selection signals YB0 through YB15 are sequentially activated. For example, while each of the second selection signals YB0 through YB15 is activated, the first selection signals YA0 through YA15 are sequentially activated. As can be seen from such a structure and control method, for example, a single data bit DL0 is selected from among 256 latched data bits ND_LAT0 through ND_LAT254.

A page size may increase to meet users' demands for increase in data input/output speed. However, when the page size increases, the following problems may occur: As is known, a program/erase operation includes a verify operation for determining whether a memory cell is normally programmed or erased. During the verify operation, the memory cells, i.e., bit lines of the selected page are sequentially scanned. This scan operation is referred to as "verification scan," "column scan," or "Y-scan".

The erase operation generally takes a relatively long time (e.g., 2 ms). Accordingly, the erase operation is not usually restricted by time taken for the Y-scan (hereinafter, referred to as "Y-scan time"). However, because the page program operation generally takes a relatively short time (e.g., 240 μs or less), the Y-scan time may not be ignored in the page program operation. Moreover, because a page program includes an algorithm for preventing a memory cell from being excessively programmed, the Y-scan time is not ignorable.

FIG. 3 illustrates conventional programming operations. In stage 301, a host sends data to a static random access memory (SRAM) to perform a program operation. When a command indicating sequential data input is applied to a flash memory having an array of memory cells to be programmed, the SRAM transmits the data to a page buffer of the flash memory and address data and sequential data are sequentially input to an address buffer circuit ad a page buffer circuit of a memory device in stage 302. Thereafter, when a command indicating start of a programming process is applied to the memory device, a high-voltage generation circuit operates to generate high voltage to be applied to a gate in stage 303. As described above, bit lines are set to a power supply voltage (or a program inhibit voltage) or a ground voltage (or a program voltage) according to data loaded into the page buffer circuit in stage 304, which is referred to as a bit line setup operation. After the bit lines are set to the power supply voltage or the ground voltage, the high voltage generated by the high-voltage generation circuit is applied to a selected word line and the program operation is executed in stage 305. After a predetermined period of time under the above-described bias condition, a verify operation for reading data from selected cell transistors is performed. The verify operation includes program recovery (stage 306), verify read (stage 307), and Y-scan (stage 308). The program recovery is a process of converting a voltage of a bit line into a predetermined value for data read and includes discharging and precharging the bit line. The verify read is a process of reading and latching data of the bit line and may include development for reading the data of the bit line, bit line sensing, data latching, and bit line recovery. The Y-scan is a process of sequentially scanning and outputting data read from memory cells, i.e., bit lines of a selected page.

When at least one cell transistor among the selected cell transistors is not programmed sufficiently, the above-described programming process (including the bit line setup, the program execution, and the verify read) is repeated according to a predetermined program loop in stages 309 and 310. Here, a high voltage used in a subsequent program loop, e.g., a second program loop is set to be higher (for example, 0.4 V higher) than that used in a current program loop, e.g., a first program loop.

In the conventional programming operations, the Y-scan is executed after the verify read is completed. In this case, as described above, because the program operation is performed in a relatively short time, the Y-scan time is not ignorable. Moreover, because the verify read is repeated when the programming process is repeated, the Y-scan time may not be ignored.

SUMMARY

Some embodiments of the present invention may provide programming operations for reducing a program time for a nonvolatile memory device. A nonvolatile semiconductor memory device may be programmed by receiving data to be programmed into memory cells from a host, programming the data into the memory cells, performing a verify read operation to determine whether the data has been successfully programmed into the memory cells, and performing a Y-scan operation while performing the verify read operation to sequentially scan and output data read from bit lines coupled to the memory cells.

In other embodiments, the programming method is terminated if it is determined that the data has been successfully programmed into the memory cells. Programming the data is repeated if it is determined that the data has not been successfully programmed into the memory cells.

In still other embodiments, repeating programming comprises repeating programming the data according to a predetermined loop until it is determined that the data has been successfully programmed into the memory cells.

In still other embodiments, repeating programming comprises repeating programming the data using a voltage higher than a voltage used in previous programming.

In still other embodiments, performing the verify read operation comprises performing a bit line recovery operation in which the bit lines coupled to the memory cells are discharged to a ground voltage level. The Y-scan operation and the bit line recovery operation are performed simultaneously.

In still other embodiments, performing the bit line recovery operation comprises isolating each bit line from a data latch unit configured to latch data read from the respective bit line so that a voltage level of the respective bit line does not influence the read data.

In still other embodiments, programming the data comprises generating a high voltage to be applied to a gate of each of the memory cells, setting each of the bit lines to one of a power supply voltage and a ground voltage according to data loaded into a page buffer circuit, and applying the high voltage to a selected word line coupled to the memory cells.

In still other embodiments, performing the verify read operation comprises discharging each of the bit lines connected to respective ones of the memory cells to a ground voltage level, precharging each of the bit lines to a precharge voltage level, blocking a power supply voltage provided to each of the bit lines so that current in each of the bit lines flows or does not flow according to an ON or OFF state of respective ones of the memory cells and a voltage level of each of the bit lines changes, sensing the voltage level of each of the bit lines, latching data sensed from each of the bit lines, and performing a bit line recovery operation by discharging each of the bit lines to the ground voltage level. The Y-scan operation and the bit line recovery operation are performed simultaneously.

In still other embodiments, performing the bit line recovery operation comprises isolating each bit line from a data latch unit configured to latch data read from the respective bit line so that a voltage level of the respective bit line does not influence the read data.

In still other embodiments, the nonvolatile semiconductor memory device is a NAND-type flash memory device.

In further embodiments, programmed memory cells are read and a determination is made whether programming has been successfully performed in a nonvolatile semiconductor memory device by blocking a power supply voltage provided to bit lines coupled to the memory cells so that a voltage level of each of the bit lines changes according to an ON or OFF state of respective ones of the memory cells, sensing and latching data on each of the bit lines, performing a bit line recovery operation by discharging each of the bit lines to a ground voltage level, and performing a Y-scan operation to sequentially scan and output data read from the bit lines. The Y-scan operation and the bit line recovery operation are performed simultaneously.

In still further embodiments, before blocking the power supply voltage the following are performed: discharging each of the bit lines to the ground voltage level and precharging each of the bit lines to a predetermined precharge voltage.

In still further embodiments, sensing and latching data on each of the bit lines comprises storing the data in a plurality of page buffers.

In still further embodiments, the following operations are performed: determining whether data output from each of the bit lines is a first logic value, determining that the programming has been normally performed when data output from all of the page buffers are the first logic value, and determining that the programming has not been successfully performed when data output from at least one page buffer includes a second logic value.

In still further embodiments of the present invention, performing the bit line recovery operation comprises isolating each bit line from a data latch unit configured to latch data read from the respective bit line so that a voltage level of the respective bit line does not influence the read data.

In still further embodiments of the present invention, the nonvolatile semiconductor memory device is a NAND-type flash memory device.

BRIEF DESCRIPTION OF THE DRAWINGS

Other features of the present invention will be more readily understood from the following detailed description of exemplary embodiments thereof when read in conjunction with the accompanying drawings, in which.

DETAILED DESCRIPTION OF EMBODIMENTS OF THE INVENTION

Figure 1:
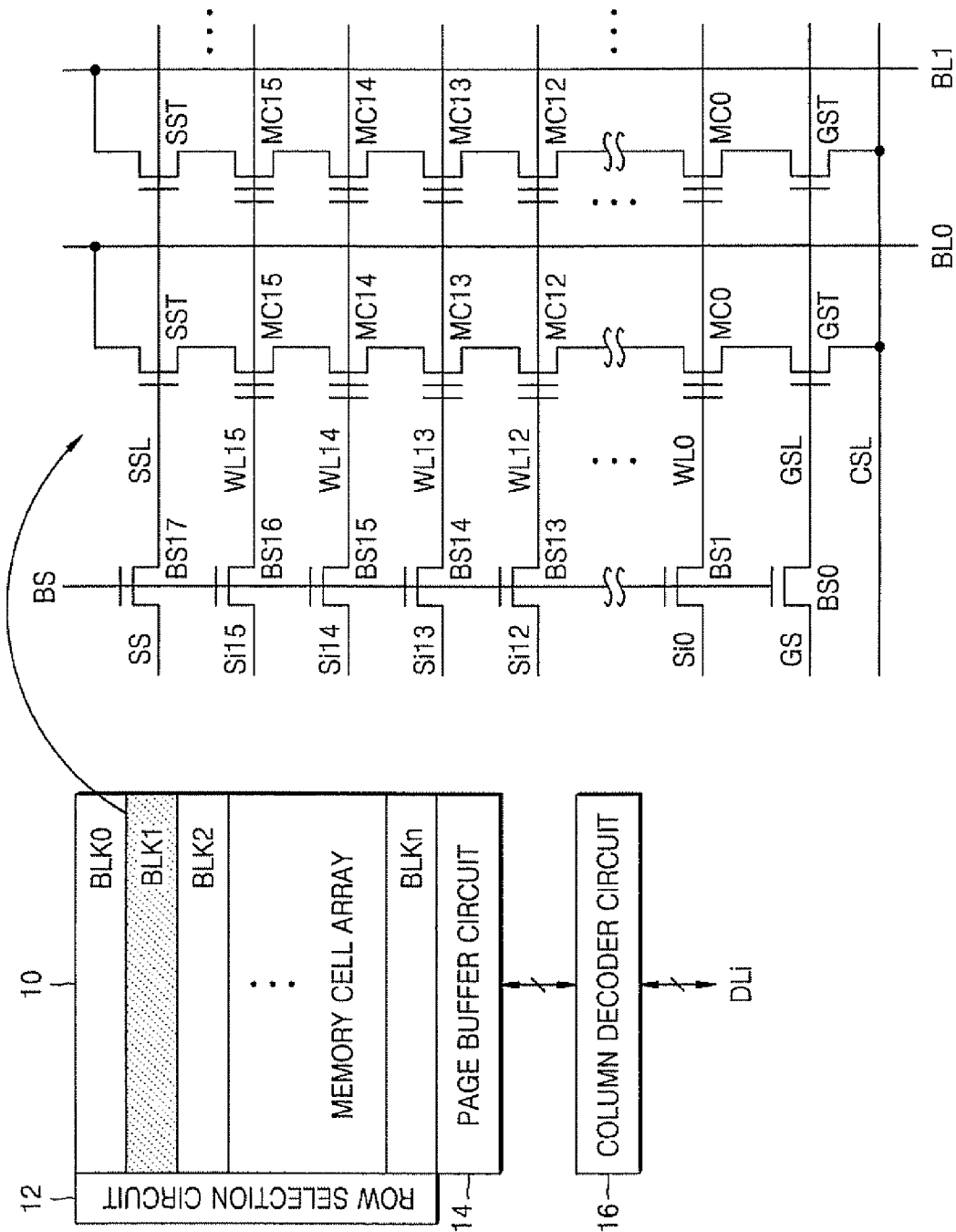
FIG. 1 is a block diagram of a conventional NAND-type flash memory device.
Figure 2:
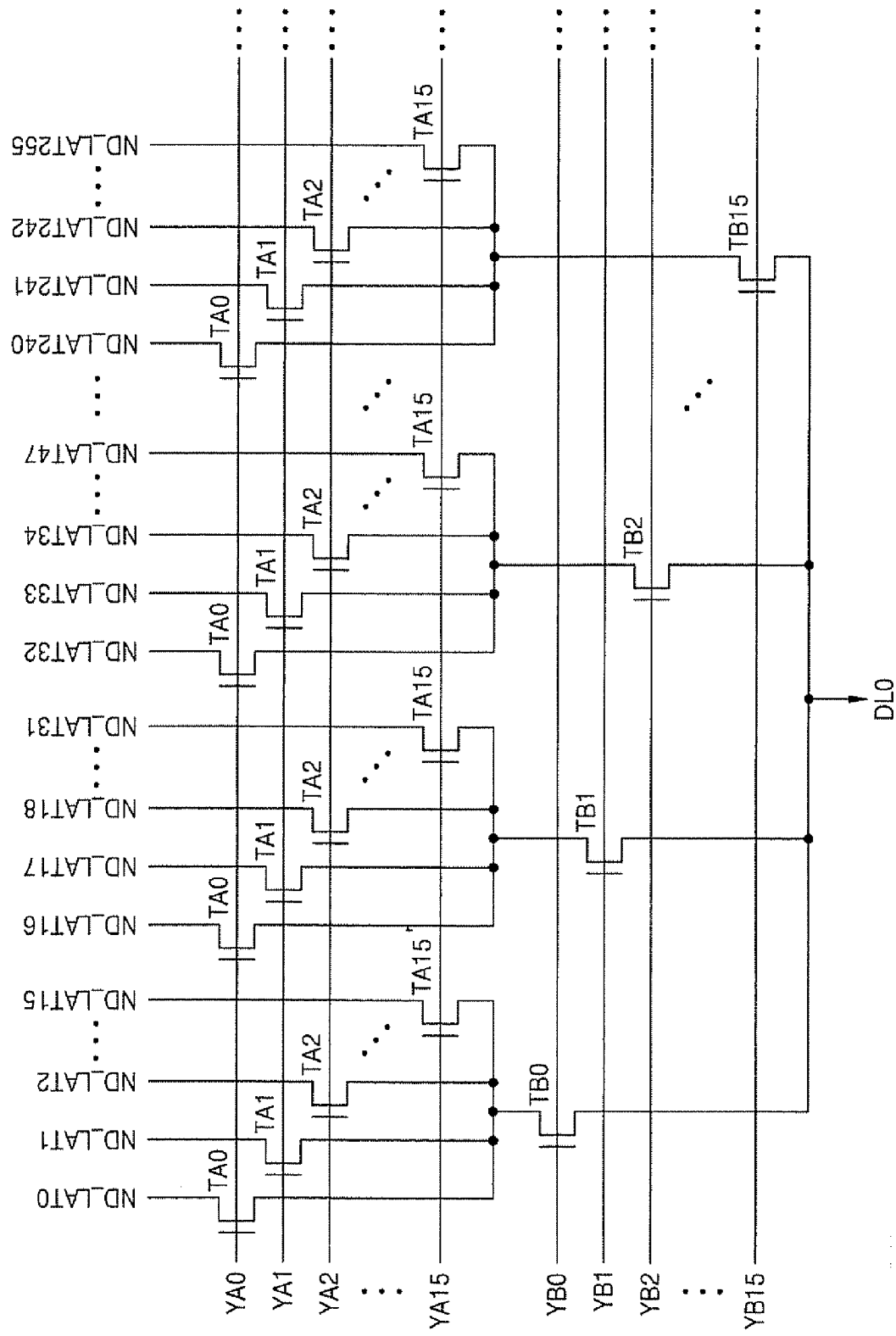
FIG. 2 is a schematic that illustrates a part of a conventional column decoder circuit.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

It will be understood that although the terms first and second are used herein to describe various components, circuits, regions, layers and/or sections, these components, circuits, regions, layers and/or sections should not be limited by these terms. These terms are only used to distinguish one component, circuit, region, layer or section from another component, circuit, region, layer or section. Thus, a first component, circuit, region, layer or section discussed below could be termed a second component, circuit, region, layer or section, and similarly, a second component, circuit, region, layer or section may be termed a first component, circuit, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention is described herein with reference to flowchart and/or block diagram illustrations of memory devices and methods of programming the same in accordance with exemplary embodiments of the invention. These flowchart and/or block diagrams further illustrate exemplary operations for programming memory devices, in accordance with some embodiments of the present invention. It should be noted that the function(s) noted in the blocks may occur out of the order noted in the figures. For example, two blocks shown in succession may, in fact, be executed substantially concurrently or the blocks may sometimes be executed in the reverse order, depending on the functionality involved.

Figure 4:
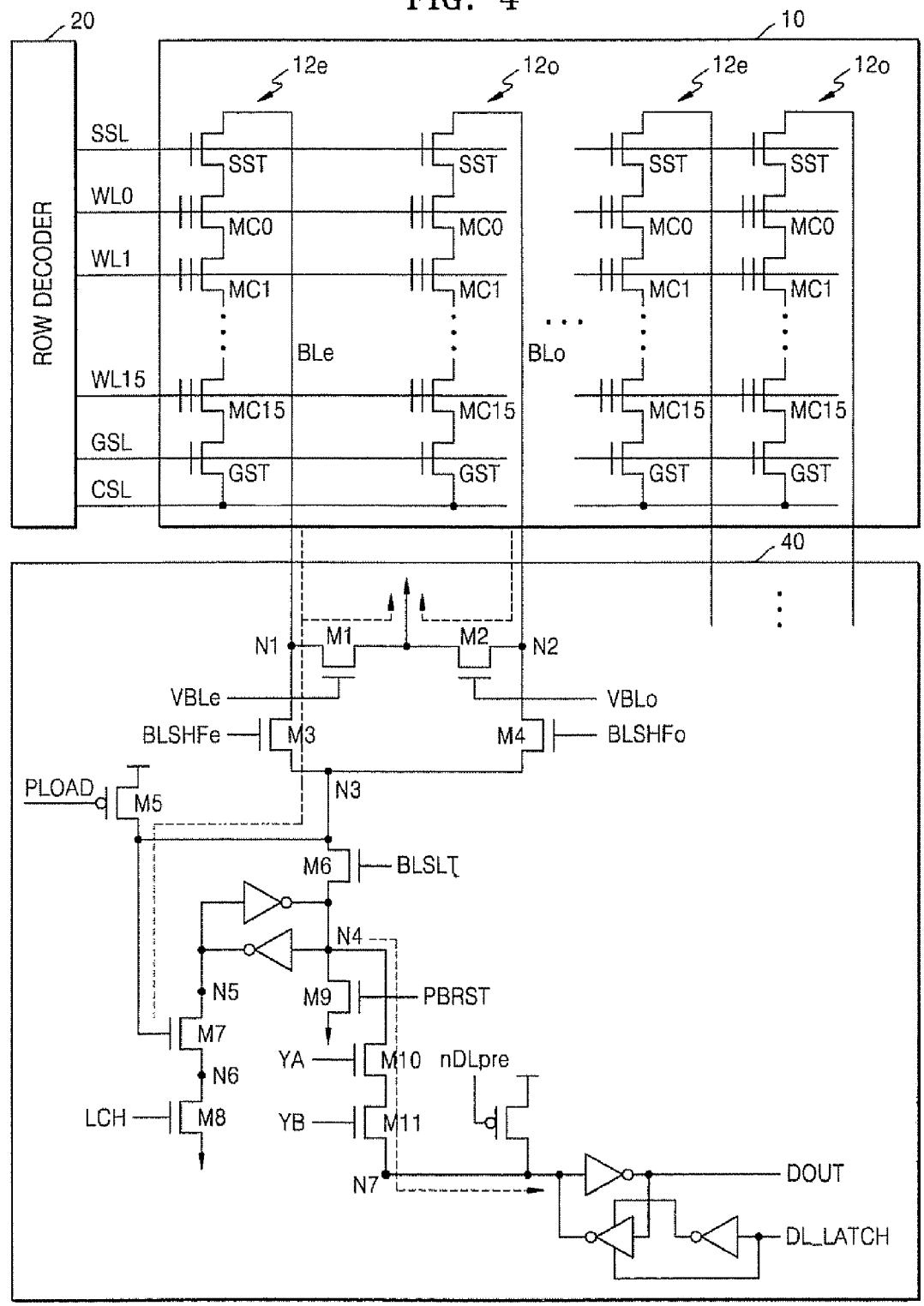
FIG. 4 is a circuit diagram that illustrates a flash memory device including a page buffer, according to some embodiments of the present invention.

FIG. 4 is a circuit diagram of a NAND-type flash memory device including a page buffer, according to some embodiments of the present invention. The NAND-type flash memory device includes a memory cell array 10, a row decoder 20, and a page buffer circuit 40.

The memory cell array 10 includes a plurality of strings 12e and 12o extending in a column direction. Each of the strings 12e and 12o includes a string selection transistor (SST) having a gate connected to a string selection line (SSL) and a ground selection transistor (GST) having a gate connected to a ground selection line (GSL). Memory cells MC0 through MC15 are connected in series between the SST and the GST. A control gate of each of the memory cells MC0 through MC15 is connected to a word line WLj. A drain of the SST is connected to a corresponding bit line BLe or BLo. A source of the GST is connected to a common source line (CSL).

FIG. 4 illustrates a part of the page buffer circuit 40 corresponding to two bit lines BLe and BLo. The structure illustrated in FIG. 4 is provided for the other bit line pairs. A single page buffer corresponds to two adjacent strings 12e and 12o included in the memory cell array 10.

In the page buffer circuit 40 illustrated in FIG. 4, first and second nodes N1 and N2 are respectively connected to the bit lines BLe and BLo. An NMOS transistor M1 is connected between the first node N1 and a ground voltage and has a gate that receives a signal VBLe. An NMOS transistor M2 is connected between the second node N2 and the ground voltage and has a gate that receives a signal VBLo. The NMOS transistors M1 and M2 respectively adjust the voltage levels of the bit lines BLe and BLo, which are inverted when activated and reduce the likelihood that the page buffer circuit 40 may be influenced by high voltage when the high voltage is applied to the bit lines BLe and BLo.

An NMOS transistor M3 is connected between the first node N1 and a third node N3. A signal BLSHFe is applied to a gate of the NMOS transistor M3. An NMOS transistor M4 is connected between the second node N2 and the third node N3. A signal BLSHFo is applied to a gate of the NMOS transistor M4. A PMOS transistor M5 is connected between a power supply voltage and the third node N3. A signal PLOAD is applied to a gate of the PMOS transistor M5. An NMOS transistor M6 is connected between the third node N3 and a fourth node N4. A signal BLSLT is applied to a gate of the NMOS transistor M6. Two inverters are connected between the fourth node N4 and a fifth node N5 and form a latch. An NMOS transistor M7 is connected between the fifth node N5 and a sixth node N6 and has a gate connected to the third node N3. An NMOS transistor M8 is connected between the sixth node N6 and the ground voltage. A signal LCH is applied to a gate of the NMOS transistor M8. An NMOS transistor M9 is connected between the fourth node N4 and the ground voltage. A signal PBRST is applied to a gate of the NMOS transistor M9. NMOS transistors M10 and M11 are connected in series between the fourth node N4 and a seventh node N7. A signal YA and a signal YB are respectively applied to gates of the NMOS transistors M10 and M11. The seventh node N7 is connected to an output line DOUT.

Figure 5:
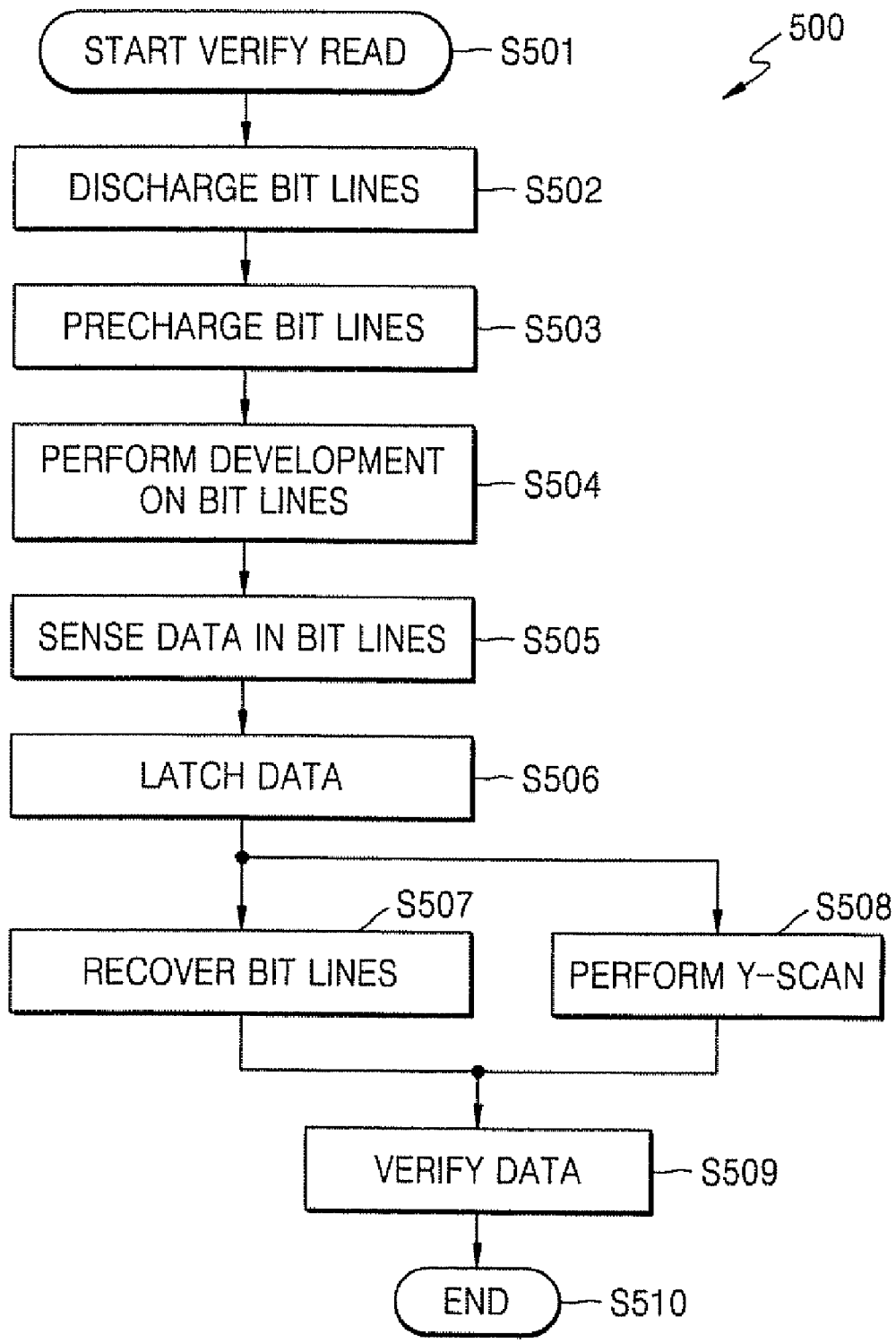
FIG. 5 is a flowchart that illustrates a verify read operation according to some embodiments of the present invention.

FIG. 5 is a flowchart of a verify read operation 500 according to some embodiments of the present invention. The verify read operation 500 is a process of sensing data in a programmed memory cell and verifying whether the memory cell has been programmed correctly. When it is verified that at least one of the selected cell transistors is not sufficiently programmed, a programming process is repeated according to a predetermined program loop.

After a programming process is completed, a verify read starts in response to a command indicating the start of the verify read operation (S501). Bit lines are discharged (S502) and precharged (S503). Development is performed on the bit lines so that voltage levels differ on the bit lines according to the states of memory cells (S504). Data on the bit lines are sensed (S505) and the sensed data is latched (S506). While bit lines having different voltage levels are being recovered according to the data (S507), the data read from the bit lines are sequentially scanned and output using a Y-scan (S508). The output data is verified to determine whether the programming process has been successfully performed (S509).

In other words, in a verify read process, according to some embodiments of the present invention, bit line recovery and Y-scan are simultaneously performed. in contrast with a conventional verify read process in which the Y-scan is performed after the bit line recovery, i.e., the verify read, the additional time dedicated for the Y-scan can be eliminated according to some embodiments of the present invention. Accordingly, when the programming process and the verify read process are performed many times, program time can be reduced.

Hereinafter, a verify read process, according to some embodiments of the present invention, will be described in detail with reference to FIGS. 4 and 5. When the voltage level of the CSL increases to about 0.7 V due to current flowing through many unprogrammed cells and a threshold voltage (Vth) of an insufficiently programmed memory cell is 0.3 V, a read voltage (VREAD) is applied to the SSL and the GSL, 0.8 V is applied to a selected word line, and 4.5 V is applied to unselected word lines.

The signals BLSHFe and VBLe transition to the level of the power supply voltage (VDD) and the voltage level of the bit line BLe transitions to the level of the ground voltage (VSS) (S502). As a result, the bit line BLe is discharged. The signals VBLe and BLSLT transition from VDD to VSS, the signal VBLo remains at the VDD level, and the signal BLSHFe transitions from VDD to 1.5 V and then to 1.1 V lower than VDD (S503). In addition, the signal PLOAD is driven to a low level to precharge the selected bit line BLe. Then, VDD is applied to the bit line BLe via the PMOS transistor M5 and the bit line BLe is set to a precharge voltage.

The signals PLOAD, BLSHFe, and VBLe transition to the VSS level (S504). If a selected memory cell is an ON-cell, current in the bit line BLe flows out to the CSL. As a result, the voltage level of the bit line BLe drops. However, if the selected memory cell is an OFF-cell, the current in the bit line BLe does not flow and the bit line BLe remains at the level of the precharge voltage.

At block S505, the signal PLOAD transitions to the VDD level, the signal BLSHFe transitions to a sensing voltage level, and the signal VBLe remains at the VSS level. Then, the voltage level of the bit line BLe is transmitted to the third node N3 via the transistor M3.

At block S506, the signals PLOAD, BLSHFe, and VBLe remain at the VDD level, the sensing voltage level, and the VSS level, respectively, and the signal LCH transitions to the VDD level. Then, the voltage level of the third node N3 is latched, thereby determining the data. For example, when the read memory cell has been programmed normally, the memory cell becomes the OFF-cell and the bit line BLe remains at the precharge voltage level (S504). Accordingly, at block S506, the transistors M7 and M8 are turned on and the fourth node N4 is at a logic "1." When the read memory cell has not been programmed normally, the memory cell becomes the ON-cell and the bit line BLe has a low voltage level (S504). Accordingly, at block S506, the transistor M7 is turned off and the fourth node N4 remains at a reset state, i.e., a logic "0."

At block S507, the signals BLSHFe and VBLe transition to the VDD level and, thus, the bit line BLe recovers to the VSS level. Here, the voltage level of the recovered bit line BLe does not influence the fourth node N4, and, therefore, the bit line recovery (S507) and the Y-scan (S508) can be performed simultaneously.

At block S508, the column selection signals YA and YB transition to the VDD level and, thus, data of the fourth node N4 is transmitted to the output line DOUT. In other words, bit line data are sequentially output according to column selection signals.

At block S509, it is determined that the output data is at the logic "1". If data output from all page buffers are at logic "1," then the programming process ends; but, if otherwise, the programming process is repeated.

Figure 3:
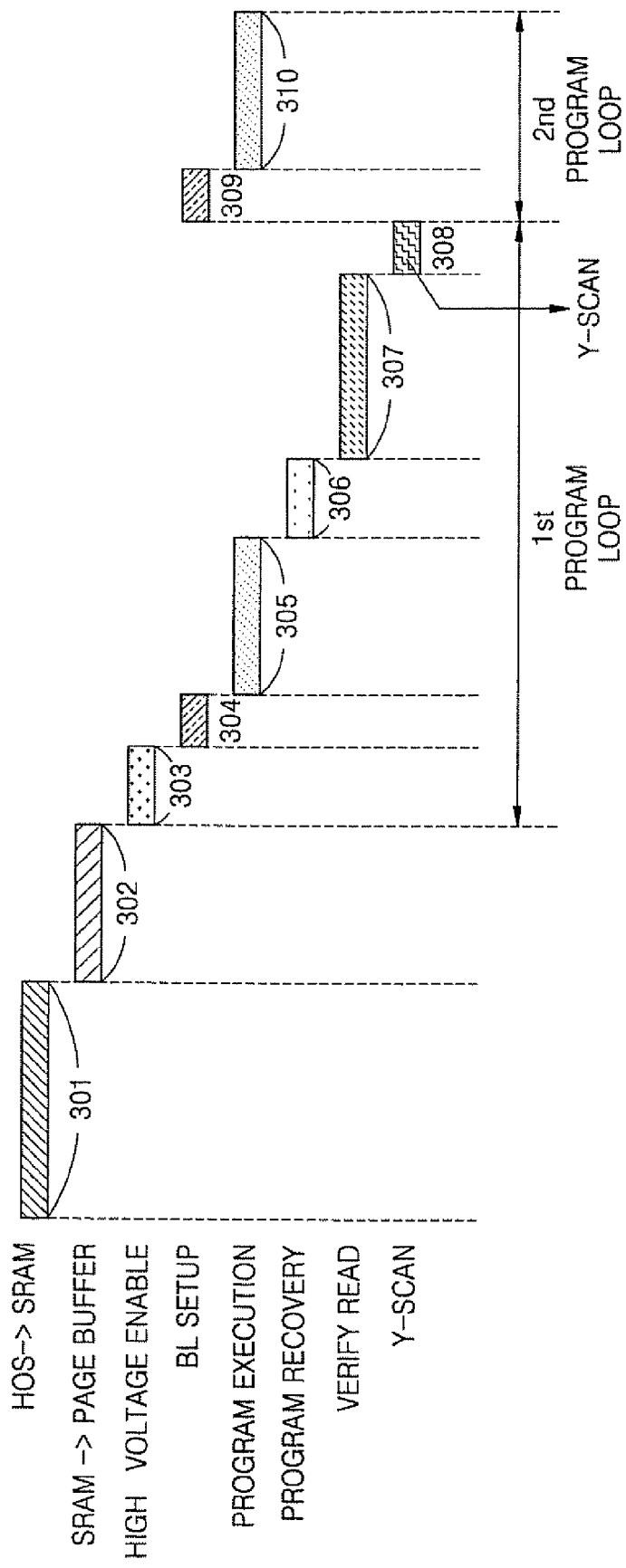
FIG. 3 is a diagram that illustrates conventional programming operations.
Figure 6:
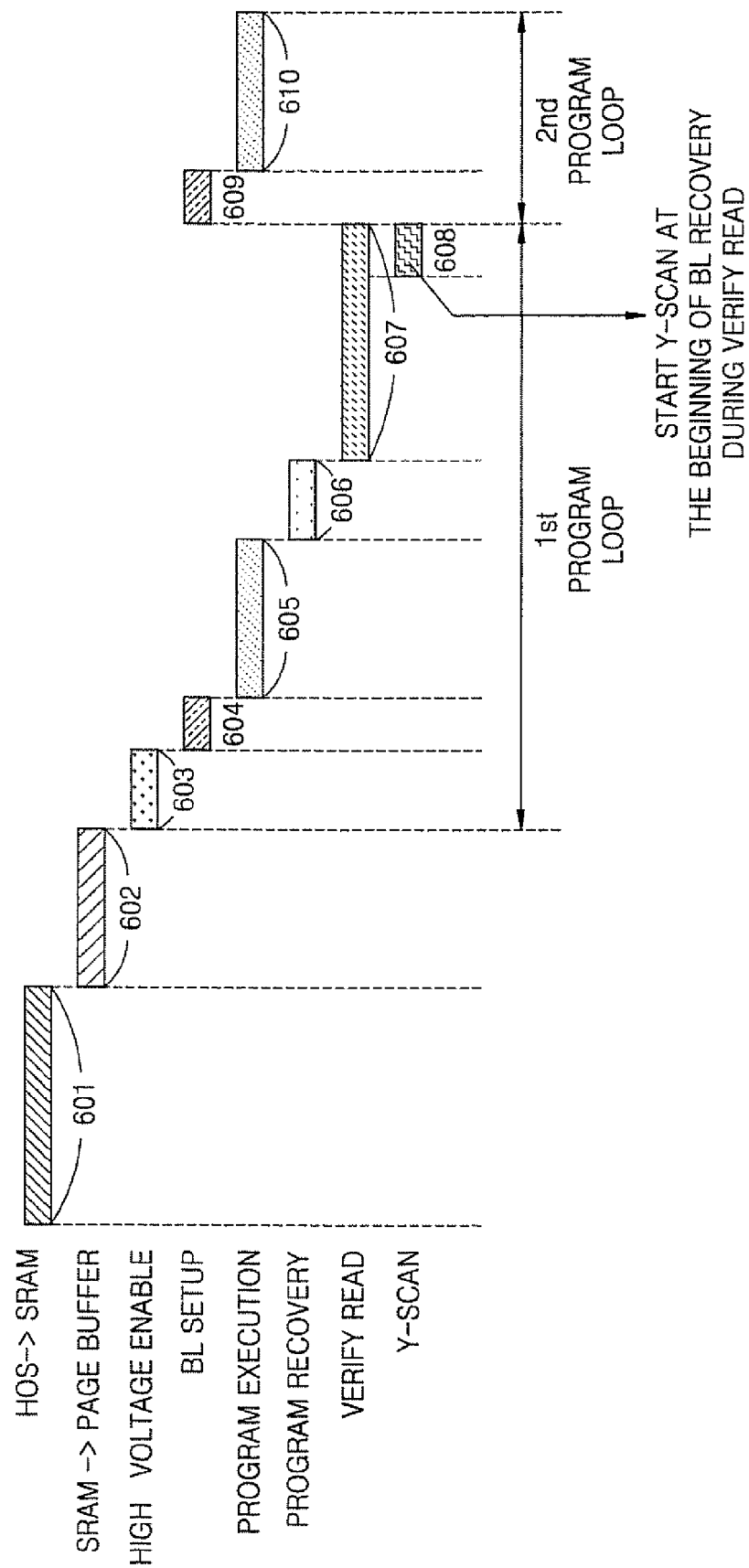
FIG. 6 is a diagram that illustrates programming operations according to some embodiments of the present invention.

FIG. 6 illustrates programming operations according to some embodiments of the present invention. The programming operations illustrated in FIG. 6 are analogous to the conventional programming operations illustrated in FIG. 3, with the exception that Y-scan (stage 608) is performed while the verify read operation (stage 607) is being performed. In more detail, the Y-scan starts at the beginning of bit line recovery during the verify read.

As described above, in a programming operation according to some embodiments of the present invention, a Y-scan is performed in parallel during a verify read operation, and, therefore, the total program time can be reduced by the duration of the Y-scan had it been performed in serial order with other programming operations. In particular, when a programming operation is repeated, Y-scan time is saved at each repetition, and, therefore, total program time may be greatly reduced.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A method of programming a nonvolatile semiconductor memory device, comprising:
   receiving data to be programmed into memory cells;
   programming the data into the memory cells;
   performing a verify read operation to determine whether the data has been successfully programmed into the memory cells; and performing a Y-scan operation while performing the verify read operation to sequentially scan and output data read from bit lines coupled to the memory cells.

2. The method of claim 1, further comprising terminating the programming method if it is determined that the data has been successfully programmed into the memory cells; and
repeating programming the data if it is determined that the data has not been successfully programmed into the memory cells.

3. The programming method of claim 2, wherein repeating programming comprises repeating programming the data according to a predetermined loop until it is determined that the data has been successfully programmed into the memory cells.

4. The programming method of claim 3, wherein repeating programming comprises repeating programming the data using a voltage higher than a voltage used in previous programming.

5. The programming method of claim 1, wherein performing the verify read operation comprises:
performing a bit line recovery operation in which the bit lines coupled to the memory cells are discharged to a ground voltage level; and
wherein the Y-scan operation and the bit line recovery operation are performed simultaneously.

6. The programming method of claim 5, wherein performing the bit line recovery operation comprises:
isolating each bit line from a data latch unit configured to latch data read from the respective bit line so that a voltage level of the respective bit line does not influence the read data.

7. The programming method of claim 1, wherein programming the data comprises:
generating a high voltage to be applied to a gate of each of the memory cells;
setting each of the bit lines to one of a power supply voltage and a ground voltage according to data loaded into a page buffer circuit; and
applying the high voltage to a selected word line coupled to the memory cells.

8. The programming method of claim 1, wherein performing the verify read operation comprises:
discharging each of the bit lines connected to respective ones of the memory cells to a ground voltage level;
precharging each of the bit lines to a precharge voltage level;
blocking a power supply voltage provided to each of the bit lines so that current in each of the bit lines flows or does not flow according to an ON or OFF state of respective ones of the memory cells and a voltage level of each of the bit lines changes;
sensing the voltage level of each of the bit lines;
latching data sensed from each of the bit lines; and
performing a bit line recovery operation by discharging each of the bit lines to the ground voltage level;
wherein the Y-scan operation and the bit line recovery operation are performed simultaneously.

9. The programming method of claim 8, wherein performing the bit line recovery operation comprises:
isolating each bit line from a data latch unit configured to latch data read from the respective bit line so that a voltage level of the respective bit line does not influence the read data.

10. The programming method of claim 1, wherein the nonvolatile semiconductor memory device is a NAND-type flash memory device.

11. A method of reading programmed memory cells and determining whether programming has been successfully performed in a nonvolatile semiconductor memory device, comprising:
blocking a power supply voltage provided to bit lines coupled to the memory cells so that a voltage level of each of the bit lines changes according to an ON or OFF state of respective ones of the memory cells;
sensing and latching data on each of the bit lines;
performing a bit line recovery operation by discharging each of the bit lines to a ground voltage level; and
performing a Y-scan operation to sequentially scan and output data read from the bit lines;
wherein the Y-scan operation and the bit line recovery operation are performed simultaneously.

12. The method of claim 11, further comprising, before blocking the power supply voltage:
discharging each of the bit lines to the ground voltage level; and
precharging each of the bit lines to a predetermined precharge voltage.

13. The method of claim 11, wherein sensing and latching data on each of the bit lines comprises:
storing the data in a plurality of page buffers; and
wherein the method further comprises:
determining whether data output from each of the bit lines is a first logic value;
determining that the programming has been normally performed when data output from all of the page buffers are the first logic value; and
determining that the programming has not been successfully performed when data output from at least one page buffer includes a second logic value.

14. The method of claim 11, wherein performing the bit line recovery operation comprises:
isolating each bit line from a data latch unit configured to latch data read from the respective bit line so that a voltage level of the respective bit line does not influence the read data.

15. The method of claim 11, wherein the nonvolatile semiconductor memory devices is a NAND-type flash memory device.

* * * * *